United States Patent
Fujibayashi et al.

(10) Patent No.: US 12,188,151 B2
(45) Date of Patent: Jan. 7, 2025

(54) SILICON CARBIDE WAFER AND METHOD FOR MANUFACTURING THE SAME

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Hiroaki Fujibayashi, Nisshin (JP); Masatake Nagaya, Nisshin (JP); Junji Ohara, Nisshin (JP); Shinichi Hoshi, Nisshin (JP); Takashi Kanemura, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 210 days.

(21) Appl. No.: 18/069,366

(22) Filed: Dec. 21, 2022

(65) Prior Publication Data

US 2023/0203709 A1 Jun. 29, 2023

(30) Foreign Application Priority Data

Dec. 24, 2021 (JP) .................. 2021-211194

(51) Int. Cl.
| | | |
|---|---|---|
| *C30B 29/36* | (2006.01) | |
| *C30B 25/20* | (2006.01) | |
| *H01L 21/683* | (2006.01) | |
| *H01L 21/78* | (2006.01) | |
| *H01L 29/16* | (2006.01) | |

(52) U.S. Cl.
CPC .............. *C30B 29/36* (2013.01); *C30B 25/20* (2013.01); *H01L 21/6836* (2013.01); *H01L 21/78* (2013.01); *H01L 21/7813* (2013.01); *H01L 29/1608* (2013.01); *H01L 2221/68327* (2013.01)

(58) Field of Classification Search
CPC ......... C30B 25/02; C30B 25/20; C30B 29/36; H01L 21/02002; H01L 21/02378; H01L 21/0243; H01L 21/02433; H01L 21/02529; H01L 21/02576; H01L 21/02664; H01L 21/6836; H01L 21/78; H01L 21/7813; H01L 2221/68327; H01L 2221/6834; H01L 2221/68381; H01L 29/0878; H01L 29/1608; H01L 29/66068; H01L 29/7393

See application file for complete search history.

(56) References Cited

U.S. PATENT DOCUMENTS

2019/0273136 A1 9/2019 Masumoto et al.

FOREIGN PATENT DOCUMENTS

JP 2014-187379 A 10/2014

*Primary Examiner* — Lawrence D Ferguson
(74) *Attorney, Agent, or Firm* — Posz Law Group, PLC

(57) ABSTRACT

A silicon carbide wafer includes a base wafer that is made of silicon carbide and doped with an n-type impurity, and an epitaxial layer that is arranged on a main surface of the base wafer, made of silicon carbide and doped with an n-type impurity. The base wafer has a thickness $t1$ and an average impurity concentration $n1$, and the epitaxial layer has a thickness $t2$ and an average impurity concentration $n2$. The base wafer and the epitaxial layer are configured so as to satisfy a mathematical formula 1:

$$-0.0178 < 0.012 + (t2/t1) \times 0.057 - (n2/n1) \times 0.029 - \{(t2/t1) - 0.273\} \times \{(n2/n1) - 0.685\} \times 0.108 < 0.0178. \quad \text{[Formula 1]}$$

4 Claims, 11 Drawing Sheets

FIG. 5

| THICKNESS OF EPITAXIAL LAYER (μm) | AVERAGE IMPURITY CONCENTRATION OF EPITAXIAL LAYER (1/cm³) | THICKNESS RATIO ($t_2/t_1$) | AVERAGE IMPURITY CONCENTRATION RATIO ($n_2/n_1$) | CURVATURE (1/m) |
|---|---|---|---|---|
| 115 | $4.5 \times 10^{15}$ | 0.23 | 0.001 | 0.0174 |
| 141 | $2.5 \times 10^{18}$ | 0.27 | 0.500 | 0.0116 |
| 139 | $3.6 \times 10^{18}$ | 0.27 | 0.720 | 0.0079 |
| 141 | $5.8 \times 10^{18}$ | 0.27 | 0.160 | −0.0071 |
| 132 | $1.0 \times 10^{19}$ | 0.25 | 2.000 | −0.0261 |
| 8 | $1.0 \times 10^{19}$ | 0.02 | 2.000 | −0.0101 |
| 87 | $4.5 \times 10^{15}$ | 0.17 | 0.001 | 0.0096 |
| 43 | $4.5 \times 10^{15}$ | 0.08 | 0.001 | 0.0064 |
| 6 | $4.5 \times 10^{15}$ | 0.01 | 0.001 | −0.0048 |
| 112 | $4.5 \times 10^{15}$ | 0.21 | 0.001 | 0.0125 |
| 127 | $2.5 \times 10^{18}$ | 0.57 | 0.500 | 0.0409 |
| 126 | $3.6 \times 10^{18}$ | 0.56 | 0.720 | 0.0262 |
| 127 | $5.8 \times 10^{18}$ | 0.59 | 1.160 | −0.0095 |
| 128 | $7.5 \times 10^{18}$ | 0.58 | 1.500 | −0.0267 |
| 8 | $2.0 \times 10^{16}$ | 0.02 | 0.004 | −0.0032 | ured
SILICON CARBIDE WAFER AND METHOD FOR MANUFACTURING THE SAME

CROSS REFERENCE TO RELATED APPLICATION

The present application claims the benefit of priority from Japanese Patent Application No. 2021-211194 filed on Dec. 24, 2021. The entire disclosures of the above application are incorporated herein by reference.

TECHNICAL FIELD

The present disclosure relates to a silicon carbide (SiC) wafer made of SiC and a method for manufacturing the same.

BACKGROUND

It has been reported that, when a SiC wafer is produced by growing an epitaxial layer made of SiC on one surface of a base wafer made of SiC, the SiC wafer warps. If the SiC wafer is warped, transfer errors are likely to occur while the SiC wafer is transferred, or manufacturing defects such as defocusing are likely to occur when the SiC wafer is used to produce a device.

For example, it has been proposed to form a damage layer on the other surface of the base wafer opposite to the one surface on which the epitaxial layer is formed in order to suppress the warp of the SiC wafer by the Twyman effect. The damage layer is formed by increasing the surface roughness of the other surface of the base wafer, that is, by forming unevenness on the other surface of the base wafer.

SUMMARY

The present disclosure describes a silicon carbide wafer including a base wafer and an epitaxial layer, in which an amount of warp is controlled while suppressing adhesion of foreign matter. The present disclosure also describes a method for manufacturing the silicon carbide wafer.

BRIEF DESCRIPTION OF THE DRAWINGS

Objects, features and advantages of the present disclosure will become more apparent from the following detailed description made with reference to the accompanying drawings, in which like parts are designated by like reference numbers and in which:

FIG. 5 is a diagram showing the relationship between the thickness of an epitaxial layer, the average impurity concentration of the epitaxial layer, the thickness ratio, the average impurity concentration ratio, and the curvature;

DETAILED DESCRIPTION

Figure 1:
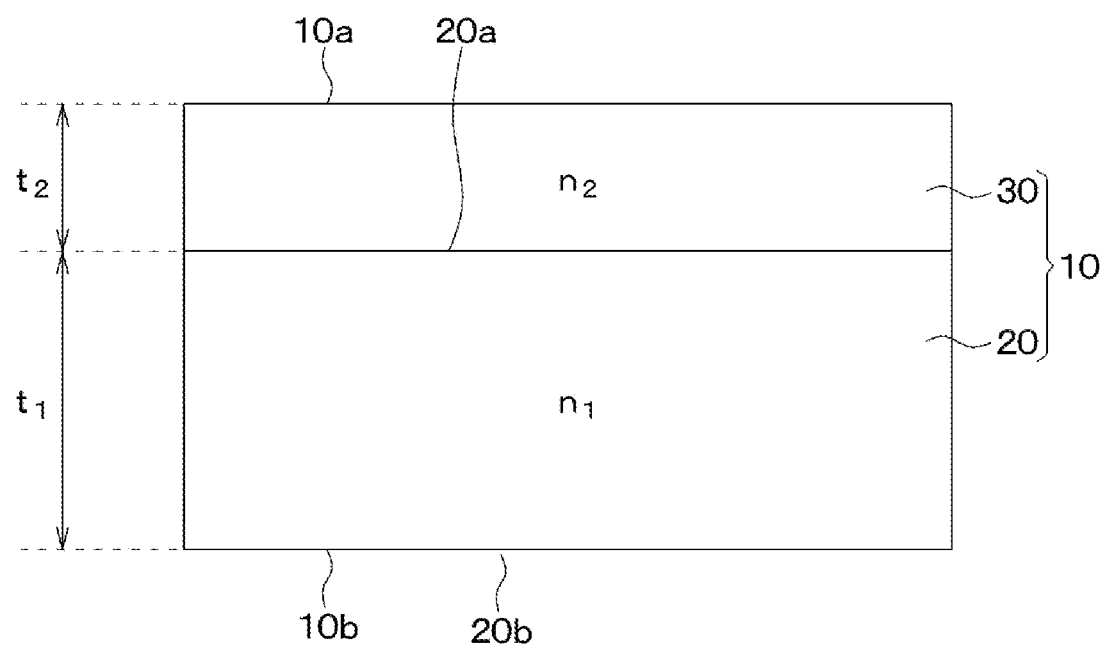
FIG. 1 is a cross-sectional view of a SiC wafer according to a first embodiment of the present disclosure.

To begin with, a relevant technology will be described only for understanding the embodiments of the present disclosure.

In a SiC wafer, although it has been proposed to form a damage layer on a other surface of a base wafer opposite to a surface on which an epitaxial layer is formed in order to suppress the warp of the SiC wafer by the Twyman effect, the damage layer is formed by increasing the surface roughness of the other surface of the base wafer, that is, by forming unevenness on the other surface of the base wafer.

However, if the surface roughness of the other surface of the base wafer is increased, foreign matter tends to adhere to the other surface of the base wafer. Further, the foreign matter is likely to scatter in subsequent processing steps after the SiC wafer is formed, and there is a possibility that the yield will decrease.

The present disclosure provides a SiC wafer and a method for manufacturing the same, in which the amount of warp is controlled and adhesion of foreign matter is suppressed.

According to an aspect of the present disclosure, a silicon carbide wafer includes: a base wafer that is made of SiC, doped with an n-type impurity, and has a first main surface and a second main surface opposite to the first main surface; and an epitaxial layer that is made of SiC, doped with an n-type impurity, and arranged on the first main surface of the base wafer. A thickness of the base wafer is referred to as $t1$, and a thickness of the epitaxial layer is referred to as $t2$. An average impurity concentration of the base wafer is referred to as $n1$, and an average impurity concentration of the epitaxial layer is referred to as $n2$. A ratio of the thickness t2 of the epitaxial layer to the thickness t1 of the base wafer is referred to as a thickness ratio t2/t1, and a ratio of the average impurity concentration n2 of the epitaxial layer to the average impurity concentration n1 of the base wafer is referred to as an average impurity concentration ratio n2/n1. The base wafer and the epitaxial layer are configured so that the thickness ratio t2/t1 and the average impurity concentration ratio n2/n1 satisfy a mathematical formula 1.

$$-0.0178 < 0.012 + (t2/t1) \times 0.057 - (n2/n1) \times 0.029 - \{(t2/t1) - 0.273\} \times \{(n2/n1) - 0.685\} \times 0.108 < 0.0178 \quad \text{[Formula 1]}$$

According to such a configuration, since the thickness ratio t2/t1 and the average impurity concentration ratio n2/n1 are adjusted, it is possible to suppress the amount of warp, that is, the absolute value of a curvature of the SiC wafer from being excessively increased. As a result, transfer errors and manufacturing defects can be suppressed. Moreover, since it is not necessary to increase the surface roughness of the SiC wafer, adhesion of foreign matter can be suppressed.

According to another aspect of the present disclosure, a method for manufacturing a SiC wafer comprising: preparing a base wafer that is made of SiC, has a first main surface and a second main surface opposite to the first main surface, and is doped with an n-type impurity; and arranging an epitaxial layer on the first main surface of the base wafer, the epitaxial layer being made of SiC and doped with an n-type impurity. In the arranging of the epitaxial layer, the epitaxial layer is arranged so as to satisfy a mathematical formula 2.

$$--0.0178 < 0.012 + (t2/t1) \times 0.057 - (n2/n1) \times 0.029 - \{(t2/t1) - 0.273\} \times \{(n2/n1) - 0.685\} \times 0.108 < 0.0178 \quad \text{[Formula 2]}$$

In the mathematical formula 2, t1 represents a thickness of the base wafer, t2 represents a thickness of the epitaxial layer, t2/t1 represents a ratio of the thickness t2 of the epitaxial layer to the thickness t1 of the base wafer. Also, n1 represents an average impurity concentration of the base wafer, n2 represents an average impurity concentration of the epitaxial layer, and n2/n1 represents a ratio of the average impurity concentration n2 of the epitaxial layer to the average impurity concentration n1 of the base wafer.

According to such a method, since the thickness ratio t2/t1 and the average impurity concentration ratio n2/n1 are adjusted, the SiC wafer in which the amount of warp, that is, the absolute value of the curvature is suppressed from being excessively increased can be manufactured. Therefore, it is possible to suppress occurrences of transfer errors in subsequent processing steps, manufacturing defects, and the like. Moreover, since it is not necessary to increase the surface roughness of the SiC wafer, adhesion of foreign matter can be suppressed.

Hereinafter, embodiments of the present disclosure will be described with reference to the drawings. In the embodiment described hereinafter, the same or equivalent parts are denoted by the same reference numerals.

First Embodiment

A first embodiment will be described with reference to the drawings. A silicon carbide (SiC) wafer of the present embodiment is, for example, used to form a SiC semiconductor device having a semiconductor element such as a metal oxide semiconductor field effect transistor (MOSFET), or an insulated gate bipolar transistor (IGBT). First, a configuration of the SiC wafer of the present embodiment will be described.

As shown in FIG. 1, a SiC wafer 10 of the present embodiment includes a base wafer 20 made of SiC and an epitaxial layer 30 made of SiC. The epitaxial layer 30 is arranged on the base wafer 20.

The base wafer 20 of the present embodiment is made of a 4H-type SiC single crystal wafer having a first main surface 20a and a second main surface 20b, and has a size of, for example, 6 inches. Further, the base wafer 20 of the present embodiment is an n-type by being doped with an n-type impurity such as nitrogen. The epitaxial layer 30 is arranged on the first main surface 20a of the base wafer 20 and is an n-type by being doped with an n-type impurity such as nitrogen. The thickness and the impurity concentration of the epitaxial layer 30 are adjusted based on the thickness and the impurity concentration of the base wafer 20, although the details will be described later. Hereinafter, a surface of the SiC wafer 10 on the epitaxial layer 30 side is referred to as one surface 10a of the SiC wafer 10, and an opposite surface of the SiC wafer 10 on the base wafer 20 side is referred to as the other surface 10b of the SiC wafer 10. The other surface 10b of the SiC wafer 10 is provided by the second main surface 20b of the base wafer 20.

Figure 2A:
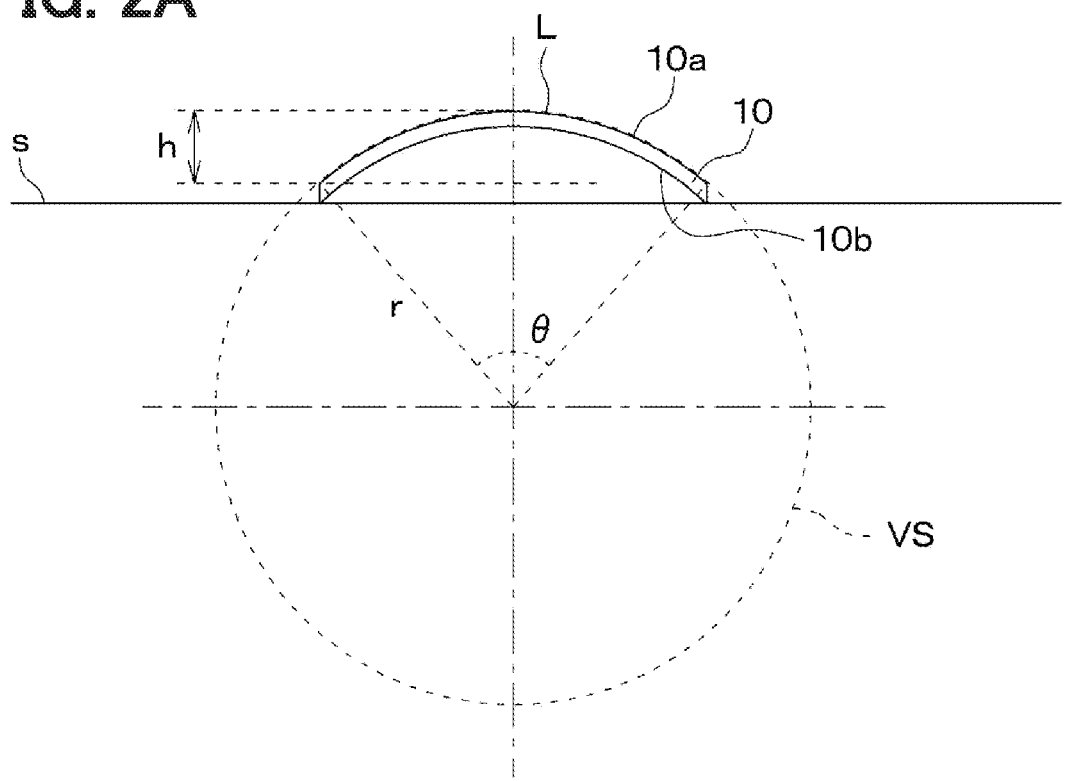
FIG. 2A is a diagram for explaining a curvature.
Figure 2B:
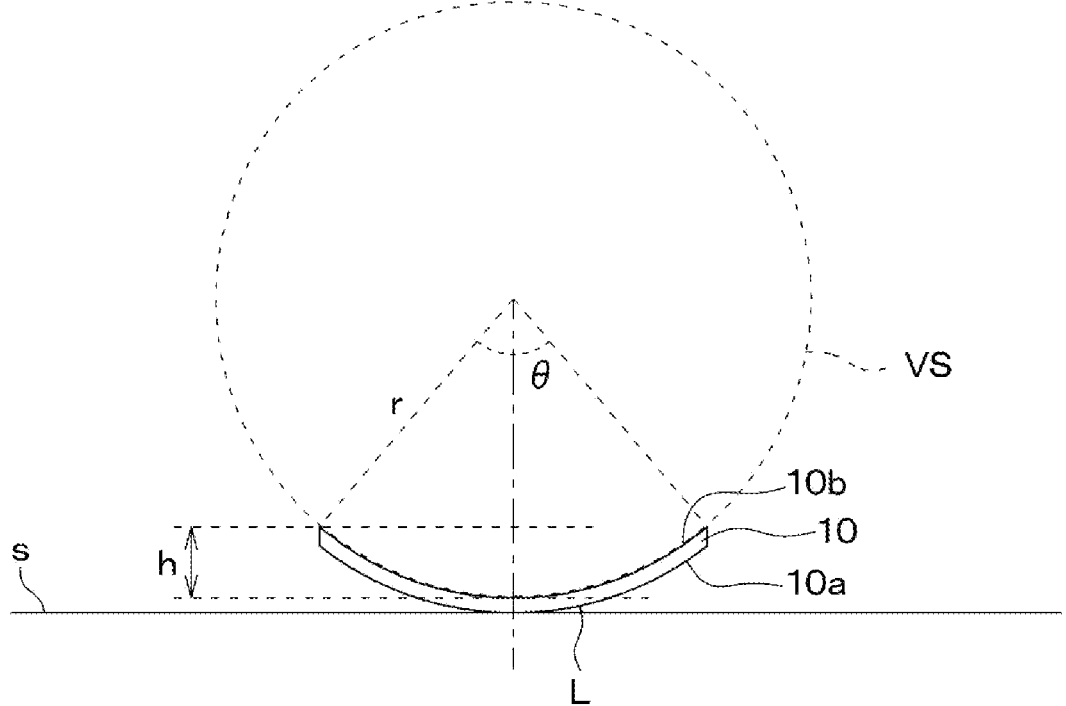
FIG. 2B is a diagram for explaining a curvature.

The SiC wafer 10 of the present embodiment is configured such that a curvature p is within a range described hereinafter. First, as shown in FIGS. 2A and 2B, when the SiC wafer 10 is placed on a plane S so that the other surface 10b of the SiC wafer 10 faces the plane S, the difference in height between the highest position and the lowest position of the one surface 10a with respect to the plane S is referred to as the amount of warp h. Then, as shown in FIG. 2A, a state in which the one surface 10a of the SiC wafer 10 has the highest position substantially in the center is referred to as an upwardly convex state. Further, as shown in FIG. 2B, a state in which the one surface 10a of the SiC wafer 10 has the highest position at an outer end is referred to as a downwardly convex state.

Further, as shown in FIGS. 2A and 2B, a virtual circle VS including the one surface 10a of the SiC wafer 10 as an arc is defined. In this case, the amount of warp h is expressed as $h = r \times (1 - \cos(\theta/2))$, in which r is the radius of the virtual circle VS, and θ is the central angle defined by the one surface 10a, that is, by the arc provided by the one surface 10a of the SiC wafer 10 included in the virtual circle VS.

Further, the diameter of SiC wafer 10, that is, the length of the arc provided by the one surface 10a of the SiC wafer 10 included in the virtual circle VS is defined as L. Thus, the diameter L is expressed as $L = r \times \theta$.

In this case, the curvature ρ is provided by the reciprocal of the radius r of the virtual circle VS whose arc is the diameter of the SiC wafer 10, and is expressed as $\rho = 1/r$. When semiconductor chips are manufactured by using the SiC wafer 10 as described above, it is desirable that the amount of warp h of the SiC wafer 10 is 50 μm or less in order to reduce the transfer errors, manufacturing defects, and the like. Therefore, it is desired that the curvature ρ be in a range from −0.0178 to 0.0178 (1/m). In other words, it is desired that the curvature ρ have an absolute value of 0.0178 (1/m) or less. The curvature ρ takes a positive value when the SiC wafer 10 is warped in the upwardly convex state. Further, the curvature ρ takes a negative value when the SiC wafer 10 is warped in the downwardly convex state. Also, the curvature ρ does not change even if the diameter (that is, inches) of the SiC wafer 10 is changed.

The inventors of the present disclosure conducted intensive studies to make the SiC wafer 10 having the curvature ρ within a range of −0.0178 to 0.0178 (1/m), and obtained the following results. Hereinafter, as shown in FIG. 1, the thickness of the base wafer 20 is referred to as t1, the thickness of the epitaxial layer 30 is referred to as t2, the average impurity concentration of the base wafer 20 is referred to as n1, and the average impurity concentration of the epitaxial layer 30 is referred to as n2. The thickness t1 of the base wafer 20 can also be referred to as a dimension of the base wafer 20 in a layered direction in which the base wafer 20 and the epitaxial layer 30 are layered. Similarly, the thickness t2 of the epitaxial layer 30 can also be referred to as a dimension of the epitaxial layer 30 in the layering direction of the base wafer 20 and the epitaxial layer 30. In the following, the ratio of the thickness t2 of the epitaxial layer 30 to the thickness t1 of the base wafer 20 is referred to as a thickness ratio t2/t1, and the ratio of the average impurity concentration n2 of the epitaxial layer 30 to the average impurity concentration n1 of the base wafer 20 is referred to as an average impurity concentration ratio n2/n1.

Figure 3:
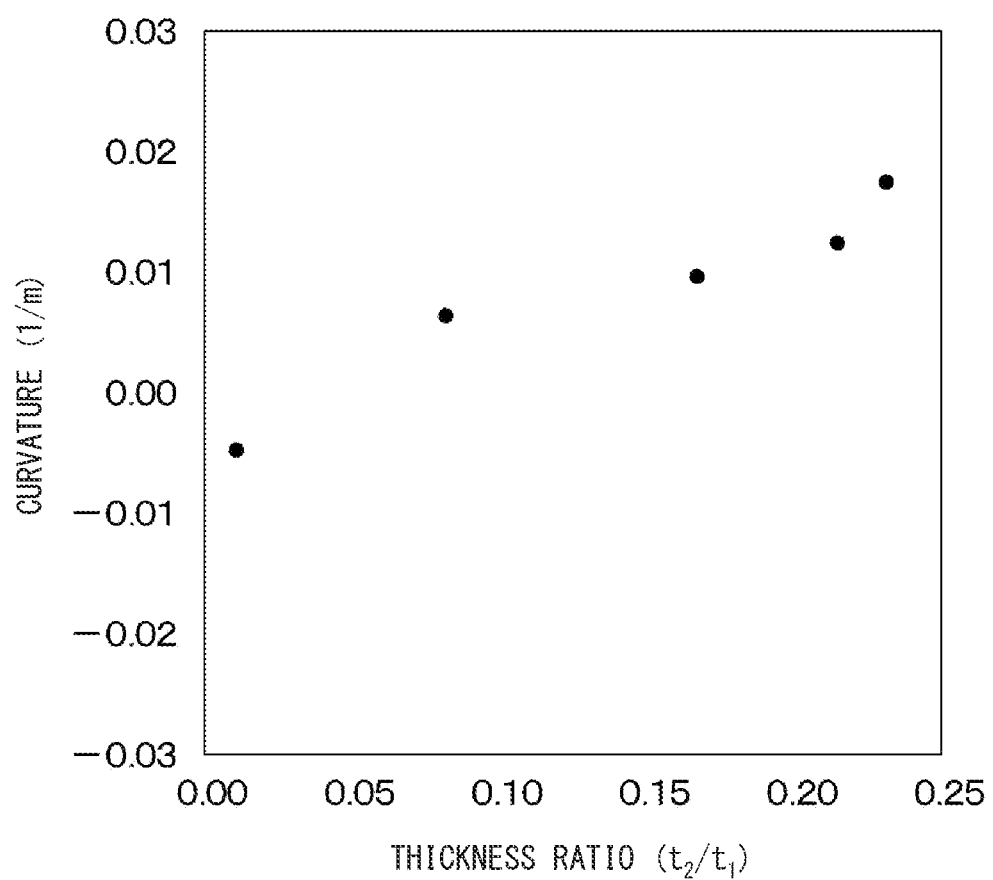
FIG. 3 is a diagram showing the relationship between a thickness ratio and a curvature.

First, in a configuration where the epitaxial layer 30 is grown on the base wafer 20, as shown in FIG. 3, it is appreciated that the curvature ρ increases as the thickness ratio t2/t1 increases. That is, it is appreciated that the curvature ρ increases as the thickness of the epitaxial layer 30 increases. Note that FIG. 3 shows the results when the average impurity concentration ratio n2/n1 is constant at 0.001.

Figure 4:
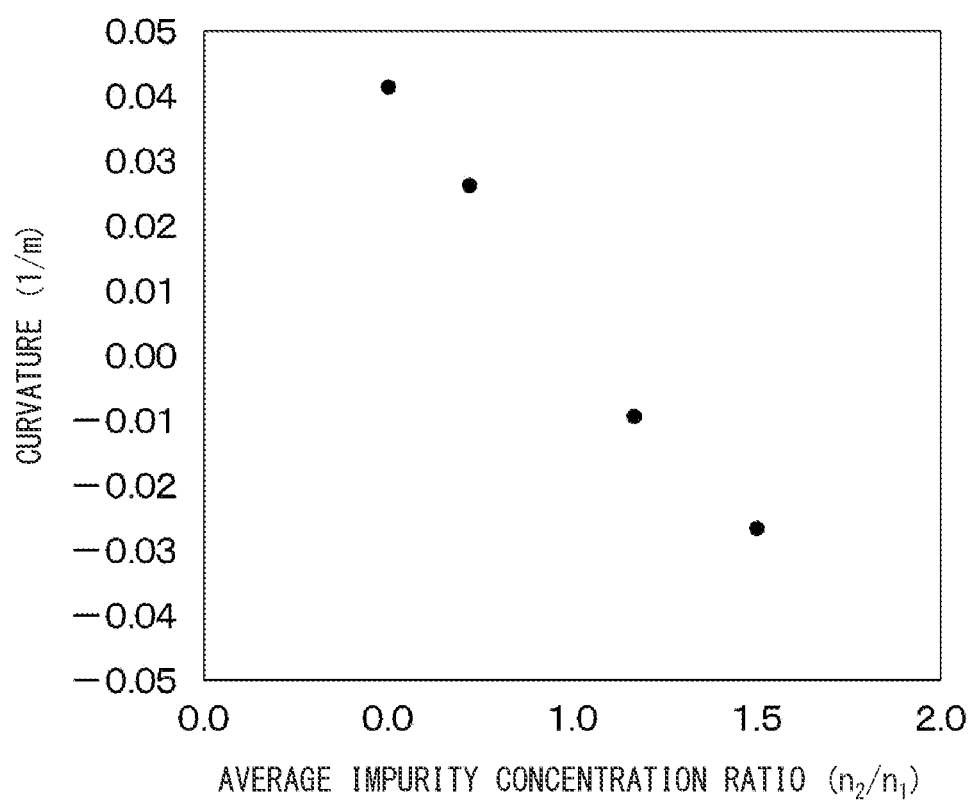
FIG. 4 is a diagram showing the relationship between an average impurity concentration ratio and a curvature.

Moreover, in the configuration where the epitaxial layer 30 is grown on the base wafer 20, as shown in FIG. 4, it is appreciated that the curvature ρ decreases as the average impurity concentration ratio n2/n1 increases. That is, it is appreciated that the curvature ρ decreases as the average impurity concentration of the epitaxial layer 30 increases. Note that FIG. 4 shows the results when the thickness ratio t2/t1 is 0.56 to 0.59.

In addition, the inventors of the present disclosure measured the curvature ρ while changing the thickness ratio t2/t1 and the average impurity concentration ratio n2/n1, and obtained the results shown in FIG. 5. Then, the inventors of the present disclosure performed a primary regression analysis based on the results shown in FIG. 5, and found that the curvature ρ in the range of −0.0178 to 0.0178 (1/m) was achieved by the followings. That is, the inventors of the present disclosure have found that the thickness ratio t2/t1 and the average impurity concentration ratio n2/n1 should be adjusted so as to satisfy the following mathematical formula 3.

−0.0178<0.012+(t2/t1)×0.057−(n2/n1)×0.029−{(t2/t1)−0.273}×{(n2/n1)−0.685}×0.108<0.0178   [Formula 3]

Therefore, in the present embodiment, the thickness ratio t2/t1 and the average impurity concentration ration n2/n1 of the SiC wafer 10 are adjusted based on the mathematical formula 3 so that the curvature ρ is in the range of −0.0178 to 0.0178 (1/m). That is, the thickness t2 and the average impurity concentration n2 of the epitaxial layer 30 are adjusted based on the thickness t1 and the average impurity concentration n1 of the base wafer 20, so that the curvature ρ is in the range of −0.0178 to 0.0178 (1/m).

Figure 6:
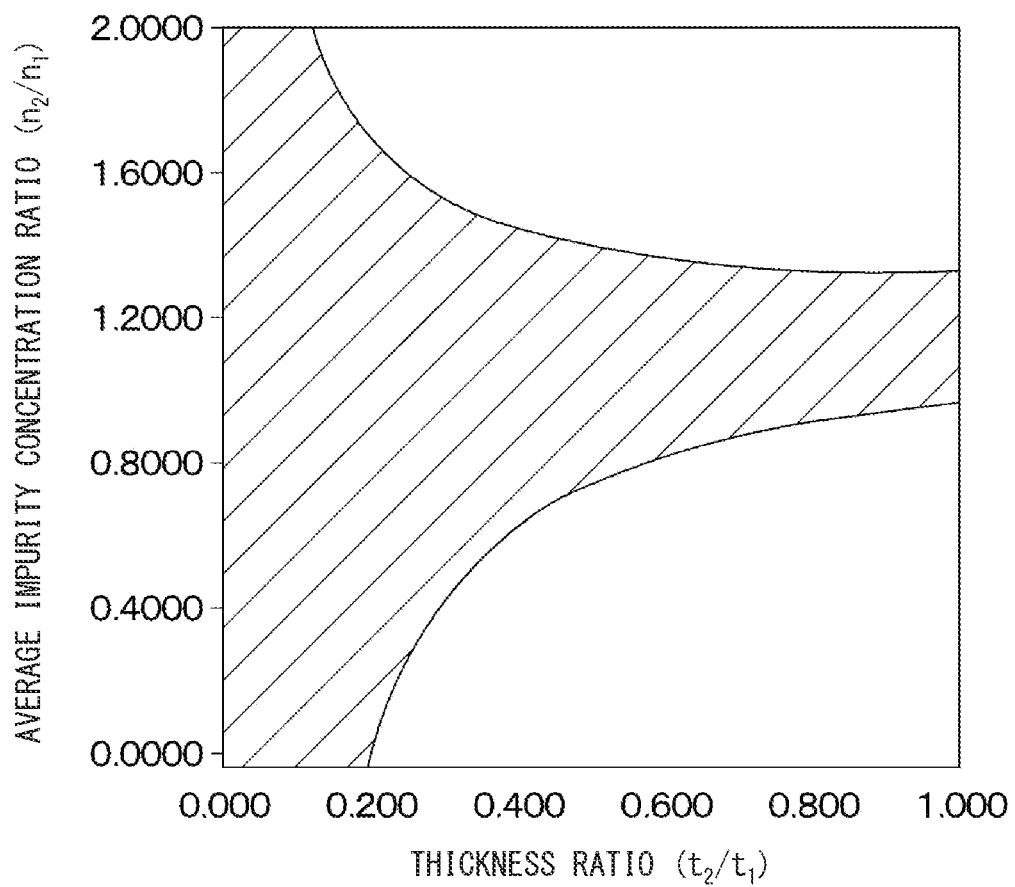
FIG. 6 is a diagram showing the relationship between the thickness ratio and the average impurity concentration ratio.
Figure 7:
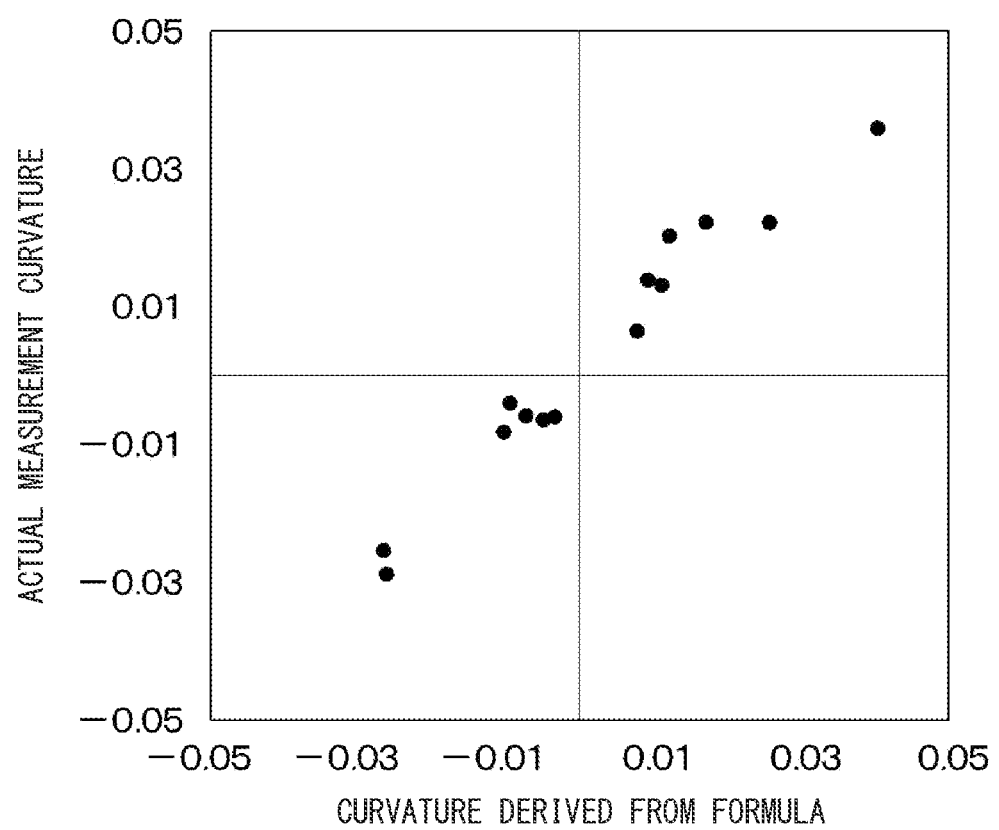
FIG. 7 is a diagram showing the relationship between the curvature derived from a relational expression and a measurement curvature.

In order to set the curvature ρ in the range of −0.0178 to 0.0178 (1/m), the thickness ratio t2/t1 and the average impurity concentration ratio n2/n1 are adjusted in the hatched range in FIG. 6. Further, the SiC wafers 10 were produced by changing the thickness ratio t2/t1 and the average impurity concentration ratio n2/n1, and the curvatures p were measured as the measurement curvatures. Also, by using those thickness ratios t2/t1 and those average impurity concentration ratios n2/n1, the curvatures p were calculated based on the mathematical formula 3. FIG. 7 shows the relationship between the measurement curvature ρ and the curvature ρ derived from the mathematical formula 3. As shown in FIG. 7, it is appreciated that the measured curvature ρ and the curvature ρ derived from the mathematical formula 3 are substantially the same.

The configuration of the SiC wafer 10 of the present embodiment has been described hereinabove. Next, a method for manufacturing a semiconductor chip including a method of manufacturing the SiC wafer 10 will be described.

Figure 8A:
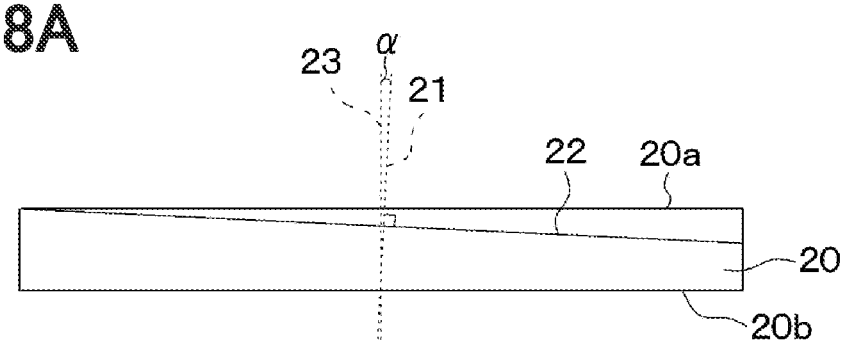
FIG. 8A is a cross-sectional view showing a manufacturing process of a semiconductor chip including a manufacturing process of a SiC wafer.

First, as shown in FIG. 8A, a base wafer 20 having a first main surface 20a and a second main surface 20b and in the form of a bulk wafer is prepared. The base wafer 20 is made of SiC and is an n-type by being doped with an n-type impurity to have a predetermined impurity concentration. The thickness of the base wafer 20 is arbitrary, but is for example about 325 μm to 525 μm. In the base wafer 20 of the present embodiment, the first main surface 20a is a Si surface and the second main surface 20b is a C surface. Further, since the base wafer 20 is irradiated with a laser beam L from the second main surface 20b side in the process of FIG. 8E described later, the second main surface 20b is mirror-finished by mirror finishing or the like. The mirror finishing is performed, for example, by polishing using a grinder or polishing such as chemical mechanical polishing (CMP).

In addition, the base wafer 20 of the present embodiment has a c-axis 21 (that is, <0001> direction) extending from the first main surface 20a to the second main surface 20b and a c-plane 22 (that is, {0001} plane) perpendicular to the c-axis 21. Further, in the present embodiment, the c-axis 21 is inclined with respect to a perpendicular line 23 to the first main surface 20a, and the c-plane 22 and the first main surface 20a define a predetermined off angle α therebetween. The off angle α is, for example, approximately 4°. However, the off angle α is not limited to this example, and is appropriately set according to semiconductor elements to be manufactured. For example, the off angle α is appropriately set in a range of less than 10°.

Figure 8B:
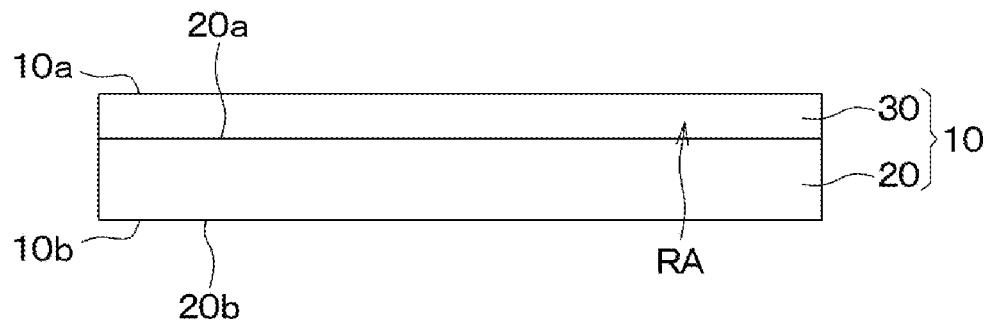
FIG. 8B is a cross-sectional view showing a manufacturing process of the semiconductor chip subsequent to FIG. 8A.

Further, the base wafer 20 of the present embodiment can also be prepared by reusing a recycle wafer 80 produced in the process of FIG. 8F, which will be described later. Therefore, if necessary, a protective film made of an oxide film or the like may be formed on the second main surface 20b of the SiC wafer 10 or the like. In FIG. 8B and subsequent figures, the illustrations of the c-axis 21, the c-plane 22, and the perpendicular line 23 are omitted for the ease of understanding in the figures.

Next, as shown in FIG. 8B, an epitaxial layer 30 is formed on the first main surface 20a of the base wafer 20, which is the n-type as being doped with an n-type impurity. Thus, the SiC wafer 10 having the one surface 10a and the other surface 10b is produced. In the present embodiment, by adjusting the thickness ratio t2/t1 and the average impurity concentration ratio n2/n1 based on the mathematical formula 3 described above, the SiC wafer 10 having the curvature ρ in the range of −0.0178 to 0.0178 (1/m) is provided.

As described above, the SiC wafer 10 shown in FIG. 1 is produced. In this case, since the curvature ρ is in the range of −0.0178 to 0.0178 (1/m), it is possible to suppress the occurrence of transfer errors during subsequent transfer and the occurrence of manufacturing defects during manufacturing. Further, in the present embodiment, the curvature ρ, that is, the amount of warp h is adjusted by adjusting the thickness ratio t2/t1 and the average impurity concentration ratio n2/n1. Therefore, it is not necessary to increase the surface roughness of the other surface 10b of the SiC wafer 10. Therefore, it is possible to suppress foreign matter from adhering to the other surface 10b of the SiC wafer 10, and to suppress the decrease in yield in subsequent processing steps.

The SiC wafer 10 produced as described above has a chip formation region RA, in which semiconductor elements are to be formed, on the one surface 10a side. In addition, the epitaxial layer 30 provides a part in which a first surface-side element constituent portion 42 constituting a semiconductor element is formed. The first surface-side element constituent portion 42, for example, includes a diffusion layer, and will be described later.

Figure 8C:
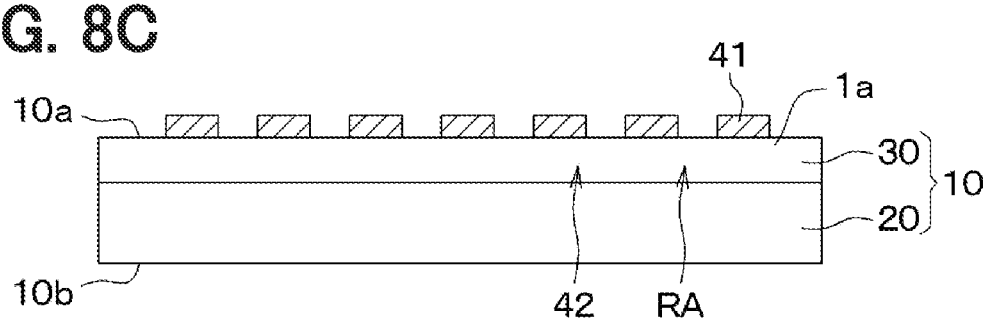
FIG. 8C is a cross-sectional view showing a manufacturing process of the semiconductor chip subsequent to FIG. 8B.

Next, as shown in FIG. 8C, general semiconductor manufacturing processes are performed. Namely, processes for forming the first surface-side element constituent portion 42 of the semiconductor element, such as a gate electrode 41, a diffusion layer (not shown), a surface electrode (not shown), a wiring pattern (not shown), or a passivation film (not shown), are formed in each chip formation region RA. It should be noted that the semiconductor element used herein may have various configurations, and may be a power device, for example. Thereafter, a surface protection film made of a resist or the like is formed on the one surface 10a side of the SiC wafer 10, if necessary.

Figure 8D:
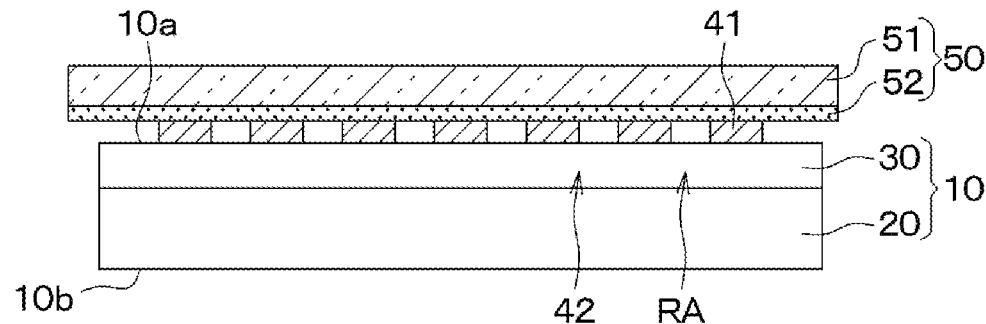
FIG. 8D is a cross-sectional view showing a manufacturing process of the semiconductor chip subsequent to FIG. 8C.

Subsequently, as shown in FIG. 8D, a holding member 50 is arranged on the one surface 10a side of the SiC wafer 10. As the holding member 50, for example, a dicing tape having a base material 51 and an adhesive 52 is used. The base material 51 is made of a material that does not easily warp during the manufacturing process. For example, the base material 51 is made of glass, a silicon substrate, ceramics, or the like. The adhesive 52 is made of a material whose adhesive strength is changeable. For example, the adhesive 52 is made of an adhesive whose adhesive force changes depending on temperature or light. In this case, the adhesive 52 is made of, for example, an ultraviolet curable resin, wax, double-sided tape, or the like. Note that the adhesive 52 is made of a material that maintains its adhesive force even when a second surface-side element constituent portion 44 of FIG. 8G, which will be described later, is formed.

Figure 8E:
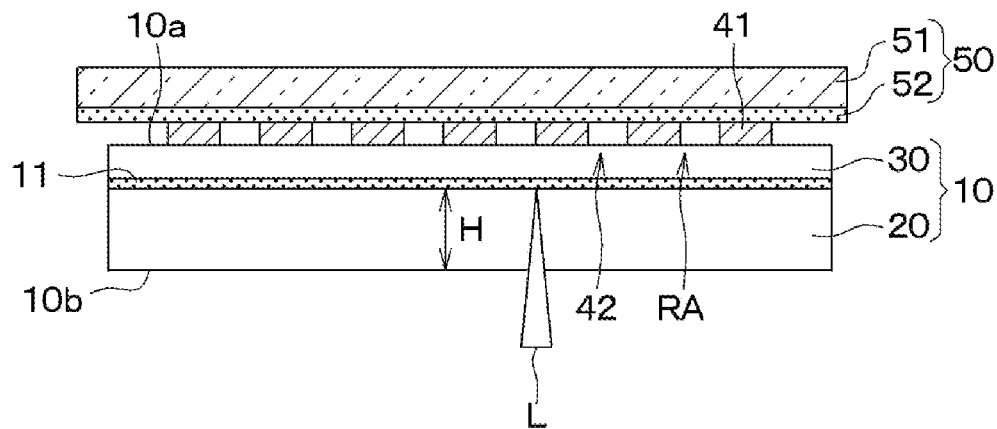
FIG. 8E is a cross-sectional view showing a manufacturing process of the semiconductor chip subsequent to FIG. 8D.

Next, as shown in FIG. 8E, the laser beam L is applied in a normal direction to the other surface 10b of the SiC wafer 10 to form a modified layer 11 at a predetermined depth H from the other surface 10b of the SiC wafer 10 along a planar direction of the SiC wafer 10. In the present embodiment, the predetermined depth H for forming the modified layer 11 is set according to the ease of handling of a chip-constituent wafer 70, which will be described later, a breakdown voltage of the semiconductor chip 100, which will be described later, and the like. In the present embodiment, for example, the modified layer 11 is formed at the boundary between the base wafer 20 and the epitaxial layer 30. Here, the depth corresponds to the dimension measured from the other surface 10b in the direction from the other surface 10b toward the one surface 10a, and also corresponds to the dimension in the depth direction, which is the direction normal to the other surface 10b.

Here, the process of forming the modified layer 11 will be described. When the modified layer 11 is formed, first, a laser apparatus including a laser beam source, a mirror, a condensing lens (i.e., a condensing optical system), a displaceable stage, and the like is prepared. The laser light source oscillates the laser beam L, and the mirror is arranged to change the direction of the optical axis (that is, the optical path) of the laser beam L. The condensing lens is provided to condense the laser beam L. To form the modified layer 11, the SiC wafer 10 is then placed on the stage, and the laser beam L is applied from the other surface 10b side of the SiC wafer 10. In this case, the position of the sage and the like are adjusted so that the focal point of the laser beam L is moved relative to the SiC wafer 10 along the planar direction of the SiC wafer 10 while keeping the focal point at the predetermined depth H.

Thus, inside the SiC wafer 10, SiC is separated into amorphous Si and amorphous C by being irradiated with the laser beam L, and the amorphous C after separation absorbs the laser beam L to form an altered layer. Also, cracks propagating from the altered layer along the c-plane 22 is formed. As a result, the modified layer 11 composed of the altered layer and the cracks is formed inside the SiC wafer 10.

In the present embodiment, for example, to form the modified layer 11, the laser beam L is applied with the laser output of 2.0 W, the feed rate of 785 mm/s, and the processing time of about 15 minutes. However, these conditions are only an example, and the inventors of the present disclosure have confirmed that the modified layer 11 can be appropriately formed by adjusting respective conditions even when the laser output is higher or lower than 2.0 W.

Figure 8F:
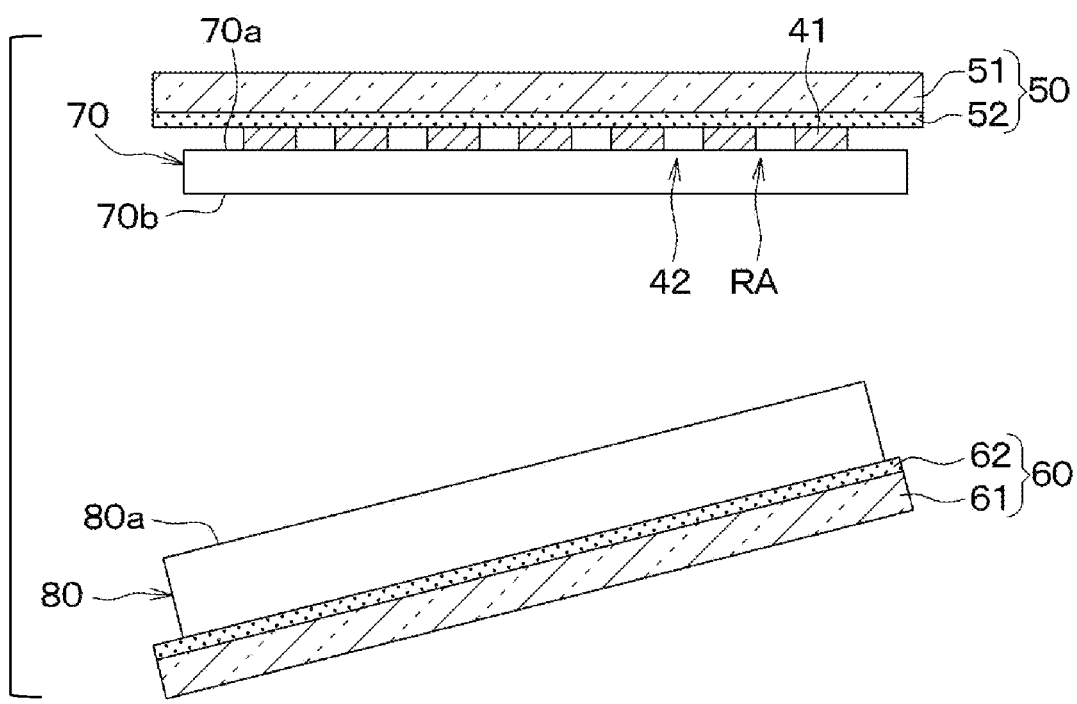
FIG. 8F is a cross-sectional view showing a manufacturing process of the semiconductor chip subsequent to FIG. 8E.

Next, as shown in FIG. 8F, an auxiliary member 60 is arranged on the other surface 10b side of the SiC wafer 10. For example, the auxiliary member 60 includes a base material 61 and an adhesive 62 whose adhesive force is changeable, similarly to the holding member 50. In this case, the base material 61 of the auxiliary member 60 is made of, for example, glass, a silicon substrate, ceramics, or the like. Also, the adhesive 62 of the auxiliary member 60 is made of, for example, an ultraviolet curable resin, wax, double-sided tape, or the like. Then, the holding member 50 and the auxiliary member 60 are held and a tensile force or the like is applied in the thickness direction of the SiC wafer 10, so that the SiC wafer 10 is separated into the chip-constituent wafer 70 and the recycle wafer 80 at the modified layer 11 as a boundary, that is, a starting point of separation.

Hereinafter, the surface of the chip-constituent wafer 70 on which the first surface-side element constituent portion 42 is formed is referred to as a first surface 70a, and the surface of the chip-constituent wafer 70 from which the recycle wafer 80 has been separated is referred to as a second surface 70b. Also, the surface of the recycle wafer 80 from which the chip-constituent wafer 70 has been separated is referred to as the one surface 80a. Further, in FIG. 8F and subsequent figures, illustrations of the modified layer 11 remaining on the second surface 70b of the chip-constituent wafer 70 and on the one surface 80a of the recycle wafer 80 are omitted as appropriate.

Figure 8G:
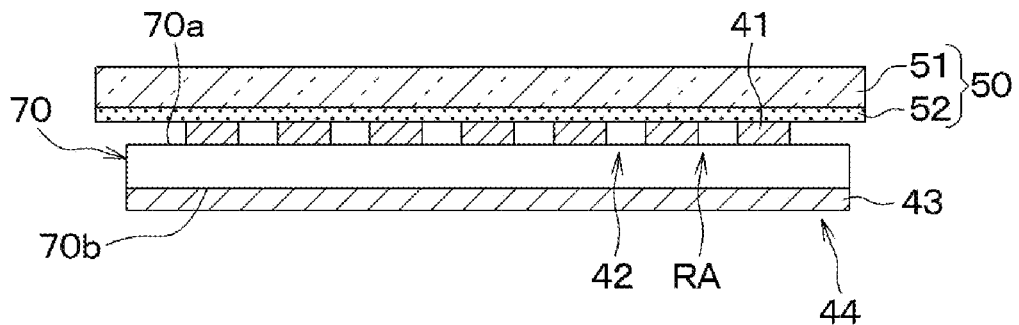
FIG. 8G is a cross-sectional view showing a manufacturing process of the semiconductor chip subsequent to FIG. 8F.

Thereafter, as shown in FIG. 8G, general semiconductor manufacturing processes are performed. For example, a process of forming the second surface-side element constituent portion 44 of the semiconductor element on the second surface 70b of the chip-constituent wafer 70 is performed. The second surface-side element constituent portion 44 is a portion constituting the semiconductor element on the second surface 70b side, and includes, for example, a metal film 43 forming a back surface electrode.

Before the process of forming the second surface-side element constituent portion 44, a process of flattening the second surface 70b of the chip-constituent wafer 70 by a chemical mechanical polishing (CMP) method or the like may be performed as necessary. FIG. 8G shows the chip-constituent wafer 70 in which the second surface 70b of the chip-constituent wafer 70 has been flattened. After performing the process of forming the second surface-side element constituent portion 44, a heat treatment such as a laser annealing or the like may be performed in order to make an ohmic contact between the metal film 43 and the second surface 70b of the chip-constituent wafer 70 as necessary.

Figure 8H:
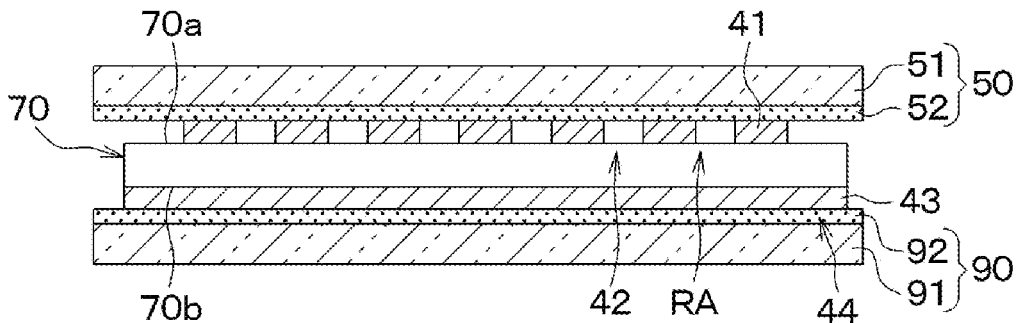
FIG. 8H is a cross-sectional view showing a manufacturing process of the semiconductor chip subsequent to FIG. 8G.

Thereafter, as shown in FIG. 8H, a support member 90 is arranged on the second surface 70b side of the chip-constituent wafer 70, that is, on the metal film 43 side. The support member 90 may be made of, for example, a dicing tape or the like. In the present embodiment, the support member 90 includes a base material 91 and an adhesive 92 whose adhesive force is changeable, similar to the holding member 50. In the case where the support member 90 includes the base material 91 and the adhesive 92, the base material 91 is made of, for example, glass, a silicon substrate, or ceramics, and the adhesive 92 is made of, for example, an ultraviolet curable resin, wax, or double-sided tape.

Figure 8I:
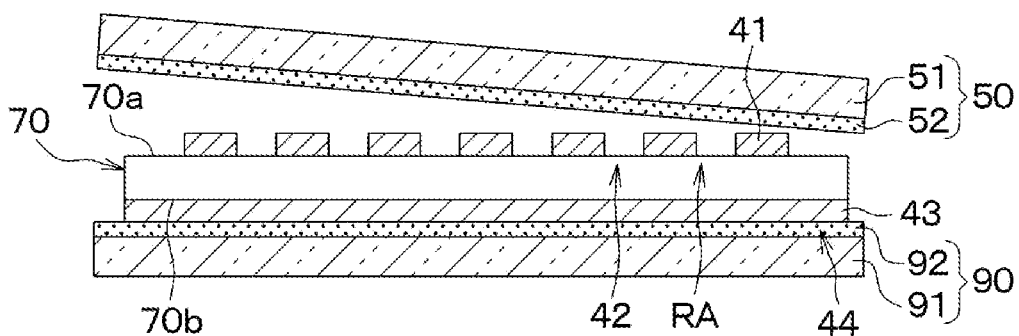
FIG. 8I is a cross-sectional view showing a manufacturing process of the semiconductor chip subsequent to FIG. 8H.

Next, as shown in FIG. 8I, the adhesive force of the adhesive 52 of the holding member 50 is weakened, and the holding member 50 attached to the first surface 70a of the chip-constituent wafer 70 is peeled off. For example, in a case where the adhesive 52 is made of an ultraviolet curable resin, the holding member 50 is peeled off by applying ultraviolet rays.

Figure 8J:
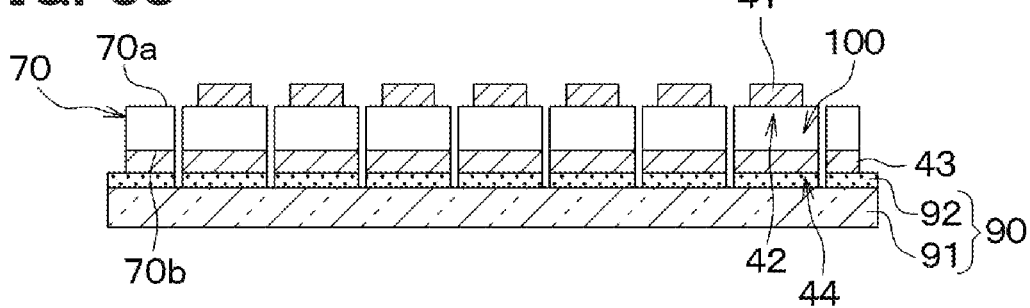
FIG. 8J is a cross-sectional view showing a manufacturing process of the semiconductor chip subsequent to FIG. 8I.

Subsequently, as shown in FIG. 8J, the chip-constituent wafer 70 is diced into pieces, that is, into chip units by a dicing saw, laser dicing, or the like. Thus, respective semiconductor chips 100 are produced. In the present embodiment, in this case, the dicing depth is adjusted so that the base material 91 of the support member 90 remains connected without being cut while the chip-constituent wafer 70 is divided into chip units.

Although the subsequent processes are not shown, the support member 90 is expanded to widen the intervals between the semiconductor chips 100 at the dicing cut portions. Thereafter, the adhesive force of the adhesive 92 is weakened by a heat treatment or irradiation with light, and the semiconductor chips 100 are picked up. In this way, the semiconductor chips 100 are manufactured.

The recycle wafer 80 produced in the process shown in FIG. 8F is reused as the base wafer 20 for the processes after FIG. 8A. Thus, the base wafer 20 can be used multiple times to produce the semiconductor chips 100. In this case, the one surface 80a of the recycled wafer 80 (that is, the base wafer 20) is preferably polished by a polishing apparatus, dry etching, or the like so that the one surface 80a is flat and the modified layer 11 does not remain.

According to the present embodiment described above, the SiC wafer 10 is adjusted so that the thickness ratio t2/t1 and the average impurity concentration ratio n2/n1 satisfy the mathematical formula 3 described above. Therefore, it is possible to suppress the amount of warp h (that is, the absolute value of the curvature ρ) from being excessively large, and it is possible to suppress the occurrence of transfer errors, manufacturing defects, and the like.

In the present embodiment, the amount of warp h (that is, the curvature ρ) is adjusted by adjusting the thickness ratio t2/t1 and the average impurity concentration ratio n2/n1 of the SiC wafer 10. As such, it is not necessary to increase the surface roughness of the other surface 10b of the SiC wafer 10. As a result, it is possible to suppress foreign matter from adhering to the other surface 10b of the SiC wafer 10, and to suppress the decrease in yield in subsequent processing steps.

Second Embodiment

A second embodiment of the present disclosure will be described hereinafter. In the present embodiment, the impurity concentration of the epitaxial layer 30 is adjusted with respect to the first embodiment. The other configurations are the same as those of the first embodiment, and therefore descriptions of the same configurations will not be repeated hereinafter.

Figure 9:
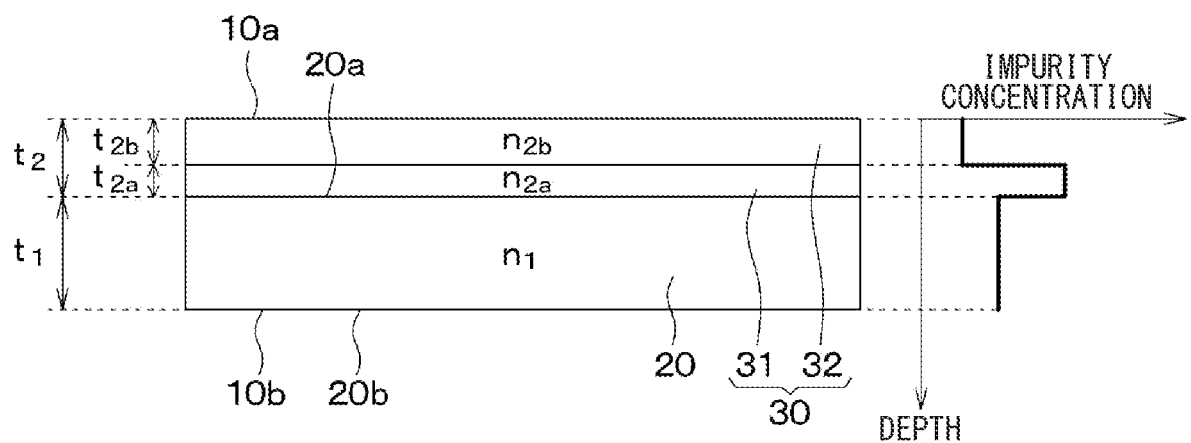
FIG. 9 is a diagram showing the relationship between a SiC wafer and an impurity concentration according to a second embodiment of the present disclosure.

In the SiC wafer 10 of the present embodiment, as shown in FIG. 9, the epitaxial layer 30 is composed of a first epitaxial layer 31 and a second epitaxial layer 32 layered on top of another. Hereinafter, the thickness of the first epitaxial layer 31 is referred to as t2a, and the average impurity concentration of the first epitaxial layer 31 is referred to as n2a. Also, the thickness of the second epitaxial layer 32 is referred to as t2b and the average impurity concentration of the second epitaxial layer 32 is referred to as n2b.

In the present embodiment, the average impurity concentration n2a of the first epitaxial layer 31 is higher than the average impurity concentration n1 of the base wafer 20, and the average impurity concentration n2b of the second epitaxial layer 32 is lower than the average impurity concentration n1 of the base wafer 20. Note that the thickness ratio t2/t1 and the average impurity concentration ratio n2/n1 of the base wafer 20 and the epitaxial layer 30 are adjusted as a whole so that the curvature ρ of the SiC wafer 10 is in the range of −0.0178 to 0.0178 (1/m). For example, when the thickness t1 of the base wafer 20 is 210 μm and the average impurity concentration n1 of the base wafer 20 is $5\times10^{18}$ $cm^{-3}$, the first epitaxial layer 31 and the second epitaxial layer 32 are configured as follows. That is, the first epitaxial layer 31 is configured so that the thickness t2a is 40 μm and the average impurity concentration n2a is $2\times10^{19}$ $cm^{-3}$, and the second epitaxial layer 32 is configured so that the thickness t2b is 100 μm and the average impurity concentration n2b is $5\times10^{14}$ $cm^{-3}$. Such an epitaxial layer 30 is formed by growing the first epitaxial layer 31 while doping the impurity at a predetermined amount, and then growing the second epitaxial layer 32 while doping the impurity at a reduced amount.

According to the present embodiment described above, the SiC wafer 10 is adjusted so that the thickness ratio t2/t1 and the average impurity concentration ratio n2/n1 satisfy the mathematical formula 3 described above. Therefore, the similar effects to those of the first embodiment can be obtained.

(1) In the present embodiment, the epitaxial layer 30 includes the first epitaxial layer 31 having the average impurity concentration n2a higher than the average impurity concentration n1 of the base wafer 20 and the second epitaxial layer 32 having the average impurity concentration n2b lower than the average impurity concentration n1 of the base wafer 20. The second epitaxial layer 32 is layered on the first epitaxial layer 31. Therefore, in forming the semiconductor chips 100, the semiconductor chips 100 having desired characteristics can be easily formed. For example, when a MOSFET is formed so that the drain region includes the first epitaxial layer 31 and the drift layer includes the second epitaxial layer 32, the breakdown voltage can be easily increased.

Modifications of Second Embodiment

Figure 10:
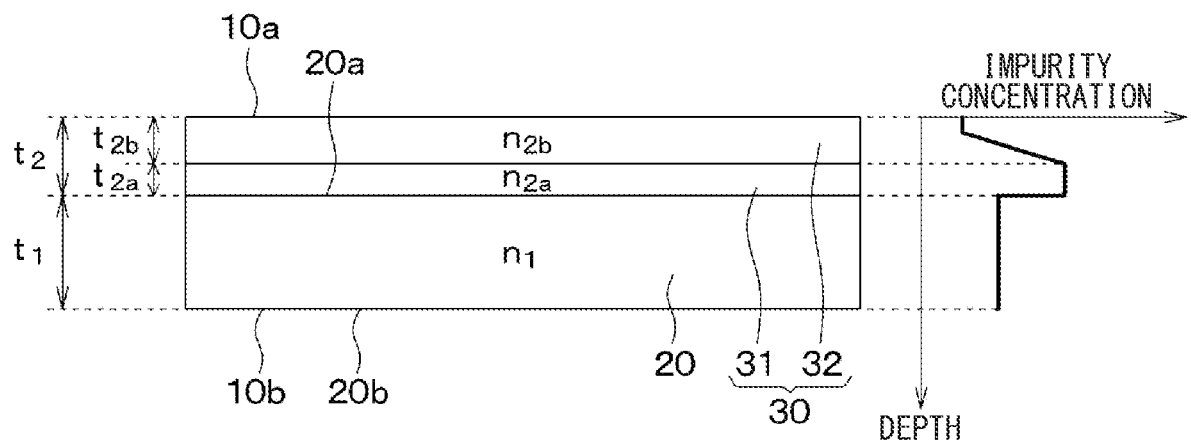
FIG. 10 is a diagram showing the relationship between a SiC wafer and an impurity concentration according to a modification of the second embodiment.

The second embodiment may be modified in various ways. For example, as a modification of the second embodiment, as shown in FIG. 10, the epitaxial layer 30 may be configured so that the impurity concentration of the second epitaxial layer 32 gradually decreases as a function of distance from the portion adjacent to the first epitaxial layer 31, in place of the configuration in which the impurity concentration sharply changes at the boundary between the first epitaxial layer 31 and the second epitaxial layer 32. Such an epitaxial layer 30 is formed by gradually reducing the amount of impurity doped at the boundary between the first epitaxial layer 31 and the second epitaxial layer 32 when growing the epitaxial layer 30. According to such a configuration, since the impurity concentration in the second epitaxial layer 32 gradually decreases, introduction of defects into the epitaxial layer 30 can be suppressed, as compared to the configuration in which the impurity concentration sharply changes at the boundary portion between the first epitaxial layer 31 and the second epitaxial layer 32.

Further, as long as the thickness ratio t2/t1 and the average impurity concentration ratio n2/n1 satisfy the mathematical formula 3, the magnitude relationship of the average impurity concentration n2a of the first epitaxial layer 31 and the average impurity concentration n2b of the second epitaxial layer 32 can be changed as appropriate. For example, both the average impurity concentration n2a of the first epitaxial layer 31 and the average impurity concentration n2b of the second epitaxial layer 32 may be higher than the average impurity concentration n1 of the base wafer 20.

In the second embodiment described above, the epitaxial layer 30 exemplarily have the two layered structure including the first epitaxial layer 31 and the second epitaxial layer 32. However, the epitaxial layer 30 may have multi-layered structure including three or more epitaxial layers.

Other Embodiments

Although the present disclosure has been described in accordance with the embodiments and examples, it is understood that the present disclosure is not limited to such embodiments and examples. The present disclosure encompasses various modifications and variations within the scope of equivalents. In addition, various combinations and configurations, as well as other combinations and configurations that include only one element, more, or less of the embodiments and examples are within the scope and spirit of the present disclosure.

In each of the embodiments described above, it is exemplified that the base wafer 20 is made of a 4H-type, 6-inch SiC single crystal wafer. As other examples, the base wafer 20 may be a 3C-type or 6H-type with the size of 2 inches or 8 inches.

What is claimed is:

1. A silicon carbide wafer comprising:
 a base wafer made of silicon carbide, having a first main surface and a second main surface opposite to the first main surface, and doped with an n-type impurity; and
 an epitaxial layer arranged on the first main surface of the base wafer, made of silicon carbide and doped with an n-type impurity, wherein
 a thickness of the base wafer is referred to as t1, a thickness of the epitaxial layer is referred to as t2, a ratio of the thickness of the epitaxial layer to the thickness of the base wafer is referred to as a thickness ratio t2/t1, an average impurity concentration of the base wafer is referred to as n1, an average impurity concentration of the epitaxial layer is referred to as n2, and a ratio of the average impurity concentration of the epitaxial layer to the average impurity concentration of the base wafer is referred to as an average impurity concentration ratio n2/n1, and the base wafer and the epitaxial layer are configured so that the thickness ratio t2/t1 and the average impurity concentration ratio n2/n1 satisfy a mathematical formula 1:

$$-0.0178 < 0.012 + (t2/t1) \times 0.057 - (n2/n1) \times 0.029 - \{(t2/t1) - 0.273\} \times \{(n2/n1) - 0.685\} \times 0.108 < 0.0178. \quad \text{[Formula 1]}$$

2. The silicon carbide wafer according to claim 1, wherein the epitaxial layer includes a first epitaxial layer disposed on the first main surface of the base wafer, and a second epitaxial layer disposed on the first epitaxial layer,
 the first epitaxial layer has an average impurity concentration higher than the average impurity concentration of the base wafer, and
 the second epitaxial layer has an average impurity concentration lower than the average impurity concentration of the base wafer.

3. The silicon carbide wafer according to claim 2, wherein the second epitaxial layer has a region, in which an impurity concentration gradually decreases, adjacent to the first epitaxial layer.

4. A method for manufacturing a silicon carbide wafer, the method comprising:
 preparing a base wafer having a first main surface and a second main surface, the base wafer being made of silicon carbide and doped with an n-type impurity; and
 arranging an epitaxial layer on the first main surface of the base wafer, the epitaxial layer being made of silicon carbide and doped with an n-type impurity, wherein
 in the arranging, the epitaxial layer is arranged so that a thickness ratio t2/t1 and an average impurity concentration ratio n2/n1 satisfy a mathematical formula 2:

$$-0.0178 < 0.012 + (t2/t1) \times 0.057 - (n2/n1) \times 0.029 - \{(t2/t1) - 0.273\} \times \{(n2/n1) - 0.685\} \times 0.108 < 0.0178 \quad \text{[Formula 2]}$$

in which t1 represents a thickness of the base wafer, t2 represents a thickness of the epitaxial layer, n1 represents an average impurity concentration of the base wafer, and n2 represents an average impurity concentration of the epitaxial layer.

* * * * *